United States Patent
Chuang et al.

(10) Patent No.: US 8,286,114 B2
(45) Date of Patent: Oct. 9, 2012

(54) 3-DIMENSIONAL DEVICE DESIGN LAYOUT

(75) Inventors: Harry Chuang, Austin, TX (US);
Kong-Beng Thei, Hsin-Chu (TW);
Mong Song Liang, Hsin-Chu (TW);
Sheng-Chen Chung, Hsin-Chu (TW);
Chih-Tsung Yao, Hsin-Chu (TW);
Jung-Hui Kao, Hsin-Chu (TW); Chung Long Cheng, Hsin-Chu (TW); Gary Shen, Hsin-Chu (TW); Gwan Sin Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 462 days.

(21) Appl. No.: 11/833,119

(22) Filed: Aug. 2, 2007

(65) Prior Publication Data
US 2008/0263492 A1 Oct. 23, 2008

Related U.S. Application Data

(60) Provisional application No. 60/925,046, filed on Apr. 18, 2007.

(51) Int. Cl.
*G06F 17/50* (2006.01)
(52) U.S. Cl. ......................................... 716/119
(58) Field of Classification Search ................ 716/1–18, 716/50–139
See application file for complete search history.

(56) References Cited

U.S. PATENT DOCUMENTS

| | | |
|---|---|---|
| 4,783,692 A | 11/1988 | Uratani |
| 6,706,571 B1 | 3/2004 | Yu et al. |
| 6,770,516 B2 | 8/2004 | Wu et al. |
| 6,844,238 B2 | 1/2005 | Yeo et al. |
| 6,858,478 B2 | 2/2005 | Chau et al. |
| 6,924,560 B2 | 8/2005 | Wang et al. |
| 7,005,330 B2 | 2/2006 | Yeo et al. |
| 7,013,447 B2 | 3/2006 | Mathew et al. |
| 7,074,656 B2 | 7/2006 | Yeo et al. |
| 7,190,050 B2 | 3/2007 | King et al. |
| 7,224,068 B2 | 5/2007 | Tseng et al. |
| 7,247,887 B2 | 7/2007 | King et al. |
| 7,265,008 B2 | 9/2007 | King et al. |
| 7,462,538 B2 | 12/2008 | Li et al. |
| 7,508,031 B2 | 3/2009 | Liu et al. |
| 7,528,465 B2 | 5/2009 | King et al. |
| 7,605,449 B2 | 10/2009 | Liu et al. |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Vuthe Siek
*Assistant Examiner* — Aric Lin
(74) *Attorney, Agent, or Firm* — Haynes and Boone, LLP (57) ABSTRACT

A method for defining a layout of 3-D devices, such as a finFET, is provided. The method includes determining an area required by a desired 3-D device and designing a circuit using planar devices having an equivalent area. The planar device corresponding to the desired 3-D device is used to layout a circuit design, thereby allowing circuit and layout designers to work at a higher level without the need to specify each individual fin or 3-D structure. Thereafter, the planar design may be converted to a 3-D design by replacing planar active areas with 3-D devices occupying an equivalent area.

20 Claims, 3 Drawing Sheets

U.S. PATENT DOCUMENTS

| | | |
|---|---|---|
| 2003/0145299 A1* | 7/2003 | Fried et al. .................. 716/11 |
| 2004/0119100 A1 | 6/2004 | Nowak et al. |
| 2005/0023633 A1* | 2/2005 | Yeo et al. .................. 257/500 |
| 2005/0111247 A1 | 5/2005 | Takaura et al. |
| 2005/0136582 A1* | 6/2005 | Aller et al. .................. 438/197 |
| 2005/0139893 A1 | 6/2005 | Hofmann et al. |
| 2005/0140029 A1 | 6/2005 | Li et al. |
| 2005/0153490 A1 | 7/2005 | Yoon et al. |
| 2005/0224986 A1 | 10/2005 | Tseng et al. |
| 2006/0138552 A1 | 6/2006 | Brask et al. |
| 2006/0157737 A1 | 7/2006 | Lim et al. |
| 2007/0026629 A1* | 2/2007 | Chen et al. .................. 438/424 |
| 2007/0093029 A1* | 4/2007 | Dao .................. 438/283 |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0207590 A1* | 9/2007 | Kiyotoshi et al. ......... 438/424 |
| 2007/0228372 A1 | 10/2007 | Yang et al. |
| 2008/0258228 A1 | 10/2008 | Chuang et al. |
| 2008/0290470 A1 | 11/2008 | King et al. |
| 2008/0296632 A1 | 12/2008 | Moroz et al. |
| 2008/0296691 A1 | 12/2008 | Chuang et al. |
| 2009/0035909 A1 | 2/2009 | Chang et al. |
| 2009/0181477 A1 | 7/2009 | King et al. |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0183961 A1 | 7/2010 | Shieh et al. |
| 2010/0203734 A1 | 8/2010 | Shieh et al. |
| 2010/0264468 A1 | 10/2010 | Xu |

OTHER PUBLICATIONS

Hsien-Hsin Lin, et al., U.S. Appl. No. 12/703,918, "Method for Fabricating A Finfet Device," filed Feb. 11, 2010, 40 pages.

Chien-Chang Su, et al., U.S. Appl. No. 12/644,869, "Method for Incorporating Impurity Element In EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

* cited by examiner

3-DIMENSIONAL DEVICE DESIGN LAYOUT

This application claims the benefit of U.S. Provisional Application No. 60/925,046, filed on Apr. 18, 2007, entitled "3-Dimensional Device Design Layout," which application is hereby incorporated herein by reference.

TECHNICAL FIELD

The present invention relates generally to semiconductors and, more particularly, to a system and method for specifying a design layout for three-dimensional devices.

BACKGROUND

Traditional semiconductor devices utilized planar devices in which portions of a substrate are doped to create a conductive region. This technology has been used in manufacturing ultra-large scale integrated (ULSI) circuits incorporating metal-oxide-semiconductor field effect transistors (MOSFETs). Reduction in the size of MOSFETs has provided continued improvement in speed, performance, circuit density, and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel.

Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the sub-30 nm regime, approaches involving the use of three-dimensional devices, such as fin field-effect transistors (finFETs), are being investigated to improve the short channel effects. Generally, fins are produced by etching a silicon substrate to form the fins.

These three-dimensional devices have been found to greatly improve the operating characteristics of the semiconductor devices. However, the three-dimensional devices may require considerably more time designing and laying out the circuit due at least in part on the increase in active areas. A planar device typically has a single, large active area, whereas a finFET device may have multiple fins. Each fin must be defined on the layout, and may require a substantial increase in effort and expense to define.

Accordingly, there is a need for a method of designing a circuit layout having three-dimensional structures.

SUMMARY OF THE INVENTION

These and other problems are generally solved or circumvented, and technical advantages are generally achieved, by preferred embodiments of the present invention which provides a method of designing and designating three-dimensional structures in a circuit layout.

In accordance with an embodiment of the present invention, a method of generating a layout having a finFET device is provided. The method includes providing a layout including a first active area, the first active area having a first width. A plurality of second active areas is automatically generated such that the width of the plurality of second active areas (plus the intermediate isolation regions) is equivalent to the first width of the first active area.

In accordance with another embodiment of the present invention, a method of generating a layout of a semiconductor device having three-dimensional active areas is provided. The method includes receiving a first layout having one or more planar active areas. The width of each of the planar active areas is determined, and an equivalent number of three-dimensional active areas occupying the same total area are determined for each of the planar active areas. A layout is then created having the three-dimensional active areas.

In yet another embodiment of the present invention, a computer program product for generating a layout having a finFET is provided. The computer program product includes computer program code for receiving a first layout having a plurality of planar active areas. Computer program code determines a number of redefined active areas for each of the planar active areas, wherein the redefined active areas have a total width less than or equal to a width of the respective planar active area.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a layout design including a finFET. The invention may also be applied, however, to other 3-dimensional devices, including raised fuses, resistors, and the like.

It is further noted that, unless indicated otherwise, all functions described herein may be performed in either hardware or software, or some combination thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
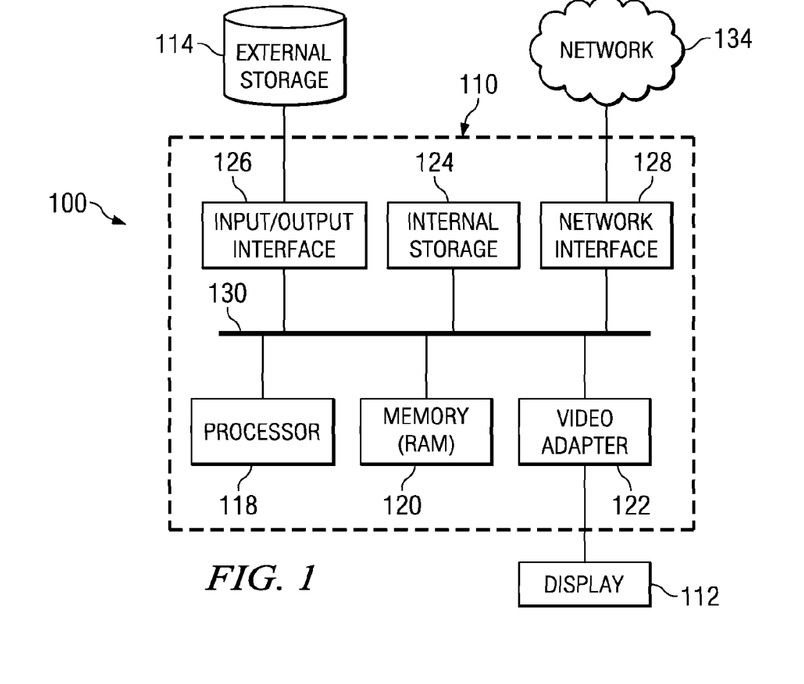
FIG. 1 is a block diagram of a system incorporating embodiments of the present invention.

With reference to FIG. 1, there is shown a block diagram of a processing system 100 in accordance with an embodiment of the present invention. It should be noted that the processing system 100 is provided for illustrative purposes only. Accordingly, one of ordinary skill in the art will realize that other components and configurations may be used. One of ordinary skill in the art will further realize that the processing system 100 includes additional components not illustrated in FIG. 1. For example, the processing system 100 may include power supplies, cables, a motherboard, removable storage media, cases, a keyboard and mouse, and the like. These other components, although not shown, are considered part of the processing system 100.

Generally, the processing system 100 includes a computer system 110 and one or more external devices, such as a display 112, external storage 114, and the like. The computer system 110 may be, for example, a desktop computer, a laptop computer, a workstation, a graphics computer, specialized equipment, or the like. In an embodiment, the computer system 110 includes a processor 118, memory (e.g., RAM) 120, a video adapter 122, internal storage (e.g., a hard drive) 124, and an input/output interface unit 126 interconnected via a bus 130. The bus 130 may include one or more different types of bus architectures, including a memory bus, a peripheral bus, video bus, or the like.

The processor 118 may comprise any suitable electronic data processor, including a Pentium™ processor from Intel Corp., an Athlon processor from Advanced Micro Devices, Inc., a Reduced Instruction Set Computer (RISC), Application-Specific Integrated Circuit (ASIC), or the like. The memory 120 may comprise any type or combination of system memory such as static random access memory (SRAM), dynamic random access memory (DRAM), synchronous DRAM (SDRAM), read-only memory (ROM), or the like. In an embodiment, the memory 120 may include ROM for use at boot-up and DRAM for data storage for use while executing programs.

The internal storage 124 may comprise any type of storage device, such as a hard drive, magnetic memory, an optical disk drive, or the like, configured to store programs and data. The video adapter 122 provides an interface to couple the processing system 110 to the display 112, and the input/output interface 126 provides an interface to other external devices, such as external storage 114.

The processing system 100 may also include a network interface 128 and/or a wireless interface (not shown). The network interface 128 allows the processor 118 to communicate with remote units via the network interface 128 and network 134. The network interface 128 also allows the processor 118 to access remote data systems communicatively coupled to the network 134.

Figure 2:
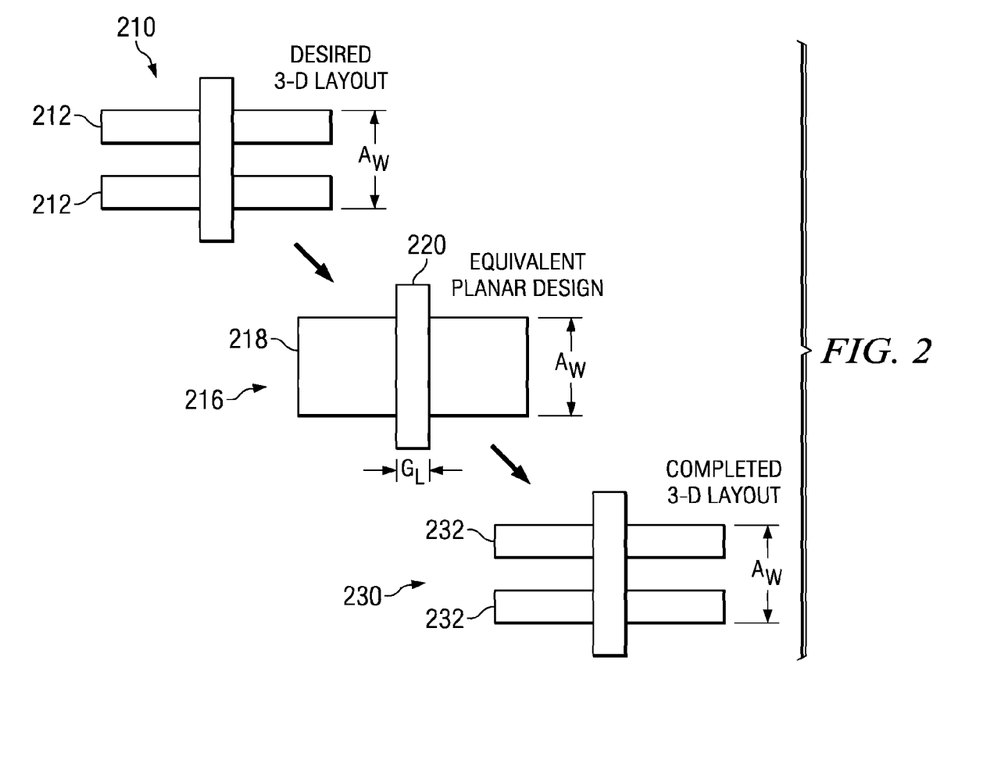
FIG. 2 is an overview of an embodiment of the present invention.

FIG. 2 illustrates an overview of an embodiment of the present invention. Generally, the process begins with a desired 3-D device 210. The desired 3-D device 210 is analyzed to determine the number of 3-D structures (e.g., fins) 212 that is desired. Based upon the number of 3-D structures that are required, a planar device 216 is created containing a planar device having an active area 218 of a size equivalent to the size occupied by the active areas (e.g., fins 212) of the desired 3-D device 210 plus any intermediate isolation areas. In this embodiment, the planar device 216 includes an active area 218 and a gate electrode 220, wherein the active area has an active area width of $A_w$ corresponding to the total area of the fins 212 plus the intermediate isolation region. Once the circuit layout of the planar device 216 is created, the active area width $A_w$ is extracted from the planar device 216 and an equivalent 3-D structure is determined to occupy the equivalent area. The complete 3-D device layout 230 is then generated using the 3-D structure, such that an area occupied by fins 232 and an intermediate isolation region is equivalent to $A_w$. In an embodiment, the entire portion of the planar device 216 is replaced with fins 232 as illustrated in FIG. 2. In a preferred embodiment, the intermediate isolation regions between adjacent fins 232 extend the entire length of the fins 232.

Thereafter, contacts to the fins 232 may be created. In an embodiment, the contacts are formed as described in co-pending U.S. patent application Ser. No. 11/833,128, which is incorporated herein by reference.

As explained in greater detail below, a designer may layout a design using the planar designs, which may be performed with less effort and more efficiently. Once the planar design is created, the completed 3-D device layout may be generated automatically. In an embodiment, the 3-D design layout is automatically generated by a software application, CAD tool, optical confinement tool, or the like.

Figure 3:
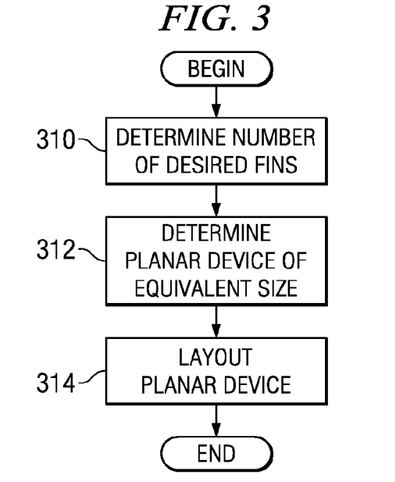
FIG. 3 is a data flow diagram illustrating steps that may be performed to create a planar design corresponding to a 3-D structure in accordance with an embodiment of the present invention.

FIG. 3 is a data flow diagram illustrating steps that may be performed to specify a 3-D device using planar structures in accordance with an embodiment of the present invention. As noted above, the following example is described in the context of a finFET device for illustrative purposes only. Accordingly, the 3-D structures refer to fins of a finFET in the following discussion. It should be understood, however, that the description disclosed below may be applied to other 3-dimensional devices, including raised fuses, resistors, and the like.

The process begins in step 310, wherein the number of fins that is desired in a design layout is determined. Generally, the number of fins will be determined by engineering techniques and may be based upon, among other things, the circuitry, saturation current, threshold current, size of each fin, size of the gate electrode, other operating characteristics, and the like.

Thereafter, in step 312, an equivalent active area of a planar device is determined. It should be noted that the equivalent active area of the planar device is equivalent in size to the size that would be required to accommodate the desired number of fins. Preferably, the size of the active area is determined by the following equation:

$$EAAS = (\#\_Fins * Fin\_Width) + ((\#\_Fins - 1) * Isolation\_Width) \qquad (1)$$

wherein

EAAS is the equivalent active area size for a planar device such that the active area for the planar device occupies an equivalent area of the sum of active areas for a desired multi-fin device;

\#\_Fins is the number of desired fins in a 3-D device;

Fin\_Width is a width of each of the desired fins in the 3-D device; and

Isolation\_Width is the width of the isolation region positioned between adjacent fins in the 3-D device.

As illustrated in the above equation, the size of an active area of a planar device is determined based upon the number of fins in the desired device. The isolation width is the region between adjacent fins. Because a fin is assumed to be along opposing boundaries of the active area, the number of isolation regions between adjacent fins is one less than the number of desired fins.

Figure 9:
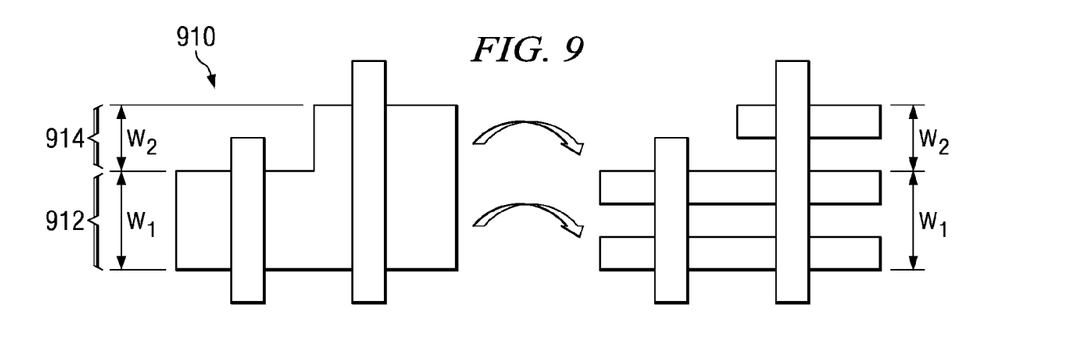

Embodiments of the present invention may also be utilized for other shapes and configurations of fins and gate electrodes. For example, FIG. 9 illustrates an embodiment of the present invention in which a design utilizes an L-shaped planar active area 910. In this embodiment, the L-shaped active area 910 comprises a first section 912 and a second section 914, wherein a first width $W_1$ of the first section 912 is wider than a second width $W_2$ of the second section 914. One of ordinary skill in the art will realize that the first section 912 having the wider first width $W_1$ may be assumed to require a raised 3-D structure along opposing outer borders.

To account for the varying configuration, equation (1) may be modified to determine the proper widths. In the above example, the first width $W_1$ may be calculated in a similar manner as EAAS in equation (1) discussed above. The second section 914, however, borders the 3-D structure along the adjacent first section 912, and thus, the second section 914 will not have a raised 3-D structure along both opposing borders, but rather will only have a raised 3-D structure along the border on the opposite side of the first section 912. The width of the first section and the second section may be determined according to the following formulas:

$$EAAS_{S1} = (\#\_Fins_{S1} * Fin\_Width) + (\#\_Fins_{S1} - 1) * Isolation\_Width) \quad (2)$$

$$EAAS_{S2} = (\#\_Fins_{S2} * Fin\_Width) + (\#\_Fins_{S2} * Isolation\_Width) \quad (3)$$

wherein $EAAS_{S1}$ is the equivalent active area size for the first section of the planar device such that the active area for the first section of the planar device occupies an equivalent area of the sum of active areas for a desired multi-fin device;

$EAAS_{S2}$ is the equivalent active area size for the second section of the planar device such that the active area for the second section of the planar device occupies an equivalent area of the sum of active areas for a desired multi-fin device;

$\#\_Fins_{S1}$ is the number of desired fins in the first section of a 3-D device;

$\#\_Fins_{S2}$ is the number of desired fins in the second section of a 3-D device;

Fin_Width is a width of each of the desired fins in the 3-D device; and

Isolation_Width is the width of the isolation region positioned between adjacent fins in the 3-D device.

Referring back to FIG. 3, processing then proceeds to step 314, wherein the integrated circuit is laid out using the equivalent active area size for a planar device (EAAS) calculated in the previous step. In this manner, a layout for a finFET device, or other 3-D device, may be created quickly and easily without the need to configure and specify each individual fin or 3-D structure.

Figure 4:
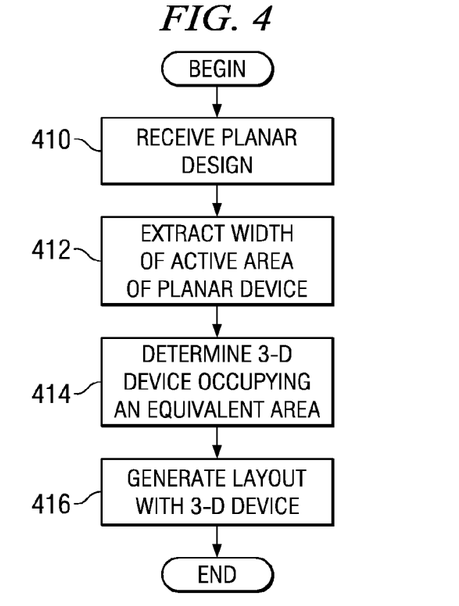
FIG. 4 is a data flow diagram illustrating steps that may be performed to convert a planar design to a 3-D design in accordance with an embodiment of the present invention.

FIG. 4 is a data flow diagram illustrating steps that may be performed to generate a 3-D device layout from planar structures in accordance with an embodiment of the present invention. The process begins in step 410, wherein a layout design specifying planar devices, such as that generated by the process discussed above with reference to FIG. 3, is received. In step 412, the size of the active areas is extracted, and in step 414, a 3-D structure is determined to occupy the corresponding active area of the planar device. In an embodiment, the 3-D structure is determined by the following equation:

$$\#\_Fins = \frac{(PAS + Isolation\_Width)}{(Fin\_Width + Isolation\_Width)} \quad (4)$$

wherein

_Fins is the number of fins to be placed in the 3-D device layout;

PAS is the planar active area size;

Isolation_Width is the width of the isolation region positioned between adjacent fins in the 3-D device; and Fin_Width is a width of each of the desired fins in the 3-D device.

It should be noted that active areas of the planar device having multiple widths, such as that illustrated in FIG. 9, in the above equation may be used on each of the varying total widths (such as $W_1$ along the left side and $W_1+W_2$ along the right side).

In step 416, a 3-D device layout is generated using the planar design received in step 410 and the 3-D device information determined in step 414. It should also be noted that the layout can be used to directly modify an existing mask, thereby negating the need for additional or intermediate masks and processing steps.

Figure 5:
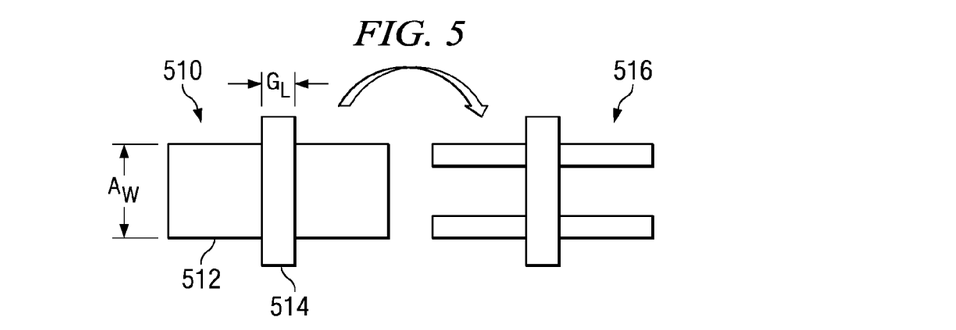
FIGS. 5-9 are examples of other embodiments of the present invention.

FIGS. 5-9 illustrate embodiments of the present invention. Referring first to FIG. 5, a planar device design 510 has been created. The planar device design 510 may be created using, for example, the process described above with reference to FIG. 3. In this embodiment, the planar device design 510 includes an active area 512 and a gate 514. The active area 512 has an active area width of $A_w$, and the gate has a gate length of $G_1$. Applying the process described above with reference to FIG. 3 to the planar device design 510, the active area width $A_w$ is extracted and an equivalent 3-D structure is determined to occupy the equivalent area.

For example, if a 3-D design having two fins with a width is 0.04 um and the width of the isolation region is 0.06 um is desired, then the planar design would be created such that the active area 512 would have an active area width $A_w$ of 0.14 um ((2 fins*0.04 um)+((2 fins−1)*0.06)). Accordingly, when the planar device design 510 is processed (such as by a process described above with reference to FIG. 4), a 3-D design 516 as illustrated in FIG. 5 is created. In an embodiment, the fin width is less than the gate length, and preferably about two-thirds of the gate length, which is preferably less than about 65 nm.

Furthermore, embodiments of the present invention may allow fins of varying widths. For example, it may be desirable to specify that fins in, for example, an I/O, a memory cell, or the like have one width, while fins in a core region have another width. In this embodiment, active areas in an I/O region having a width of, for example, 0.14 μm, 0.24 μm, 0.34 μm, etc. may be converted to fins having a width of 0.04 μm and isolation regions between adjacent fins of 0.06 μm, i.e., a pitch of about 0.1 μm, while active areas in a core region having a width of, for example, 0.18 μm, 0.31 μm, 0.44 μm, etc., may be converted to fins having a width of 0.05 μm and isolation regions between adjacent fins of 0.08 μm, i.e., a pitch of about 0.13 μm.

Figure 6:
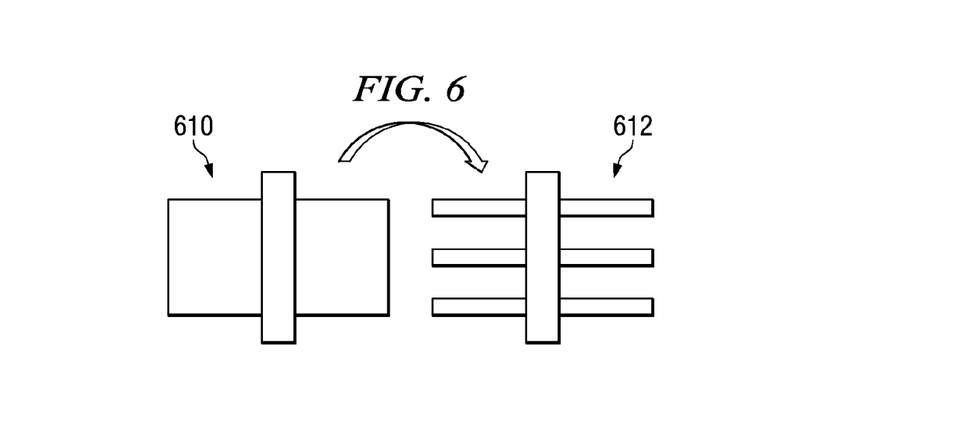
Figure 7:
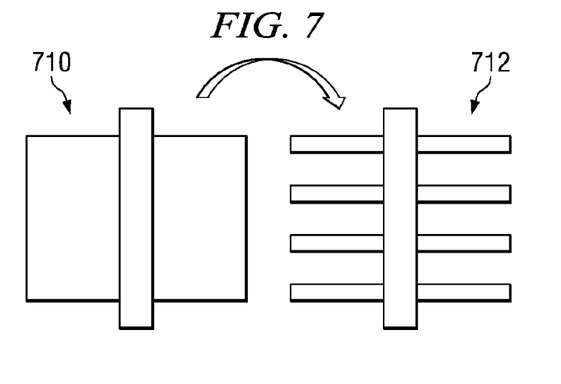
Figure 8:
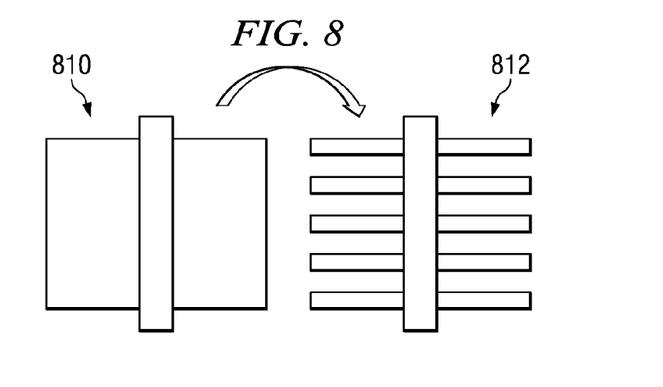

FIG. 6 illustrates a similar situation in which a planar active area 610 is replaced with three 3-D structures 612; FIG. 7 illustrates another similar situation in which a planar active area 710 is replaced with four 3-D structures 712; and FIG. 8 illustrates another similar situation in which a planar active area 810 is replaced with five 3-D structures 812.

It should be noted that while the planar device may have an active area size equivalent to the sum of active areas and isolation regions of the desired 3-D structure, the performance may not be equivalent. For example, simulation results have illustrated that the saturation current Idsat may be improved when using a 3-D structure. Results have shown that, when the fin height is about 60 nm, the fin width is about 0.04 um, and the isolation regions between adjacent fins is about 0.06 um, the saturation current of an embodiment of the 3-D structure illustrated in FIG. 5 may be improved up to 140% over the planar device occupying an equivalent area, the saturation current of an embodiment of the 3-D structure illustrated in FIG. 6 may be improved up to 100% over the planar device occupying an equivalent area, the saturation current of an embodiment of the 3-D structure illustrated in FIG. 7 may be improved up to 80% over the planar device occupying an equivalent area, and the saturation current of an embodiment of the 3-D structure illustrated in FIG. 8 may be improved up to 65% over the planar device occupying an equivalent area.

One of ordinary skill in the art will realize that embodiments of the present invention may be utilized to create mixed integrated circuits, or circuits that include both planar and 3-D structures. For example, in an embodiment in which an integrated circuit includes both a core region and a peripheral region, the core region may be designed using finFETs and the peripheral region may be designed using planar devices. In the example, the core region may include, for example, memory (e.g., SRAM) and devices in the high speed domain, minimum channel length domain, or digital domain, and the peripheral region may include, for example, devices in the low speed domain, non-minimum channel length domain, and analog domain. In this embodiment, the region including the three-dimensional devices would be processed as discussed above, while the region design for planar devices would remain.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of generating a layout of a semiconductor device having three-dimensional active areas, the method comprising the steps of:
   determining a number of three-dimensional structures defining desired three-dimensional active areas of the device;
   creating an equivalent planar device design based upon the number of three-dimensional structures defining the desired three-dimensional active areas, wherein the equivalent planar device design has an active area size substantially equivalent to a size of the three-dimensional active areas plus any intermediate isolation areas; and
   converting the equivalent planar device design to a three-dimensional design, wherein converting the equivalent planar device design to a three-dimensional design includes:
   receiving a first layout having one or more planar active areas designated thereon;
   determining a width of each planar active area, wherein the width of each planar active area is based upon the number of three-dimensional structures defining at least one of the desired three-dimensional active areas plus any intermediate isolation areas, wherein determining the width of each planar active area is based on a model equation expressed as:

$$y \equiv (A \times B) + ((A-1) \times C)$$

wherein y denotes the width, A denotes the number of three-dimensional structures, B denotes a width of each of the three-dimensional structures, and C denotes a width of each of the intermediate isolation areas;
   determining a corresponding number of the three-dimensional active areas such that the width of each of the planar active areas is substantially equivalent to a width of a total area occupied by the respective three-dimensional active areas plus isolation regions located between adjacent three-dimensional active areas in a plan view, the three-dimensional active areas and isolation regions extending across an entire length of the planar active area,
   replacing the first layout with a second layout, the second layout replacing the one or more planar active areas with the respective three-dimensional active areas and isolation regions located between adjacent three-dimensional active areas in a plan view, wherein all of the three-dimensional active areas within each respective planar active area have a length extending across the entire length of the planar active area and all of the isolation regions within each respective planar active area have a length extending across the entire length of the planar active area such that the respective lengths of the three-dimensional active areas and the isolation regions are substantially equal, wherein the replacing is performed at least in part by a CAD tool or an optical confinement tool.

2. The method of claim 1, wherein the one or more planar active areas have a gate electrode having a gate length less than about 65 nm.

3. The method of claim 1, wherein a width of each of the three-dimensional active areas is less than a gate length.

4. The method of claim 1, wherein the first layout further comprises a first active area, the first active area having an L shape such that the first active area has a first region having a first width and a second region having a second width, the plurality of the three dimensional active areas in the second layout including a first number of three-dimensional active areas having one length corresponding to the first width and a second number of three-dimensional active areas having another length corresponding to the second width, the second layout having a greater number of three-dimensional active areas in the first region than the second region.

5. The method of claim 1, wherein a width of each of the isolation regions is greater than a width of one of the three-dimensional active areas.

6. A method of generating a layout of a semiconductor device having a finFET device, the method comprising the steps of:

receiving a number of three-dimensional structures defining desired three-dimensional active areas;

determining a first active area having a first width and a first length based upon the number of three-dimensional structures defining the desired three-dimensional active areas plus any intermediate isolation areas, wherein determining the first width is based on a model equation expressed as:

$$y=(A \times B)+((A-1) \times C)$$

wherein y denotes the first width, A denotes the number of three-dimensional structures, B denotes a width of each of the three-dimensional structure, and C denotes a width of each of the intermediate isolation area;

providing a first layout having the first active area and a first gate extending over the first active area, wherein the first layout is a planar layout, wherein a size of the first active area is substantially equivalent to a size of the desired three-dimensional active areas plus any intermediate isolation areas; and automatically replacing by a design tool the first layout with a second layout, which is a three-dimensional layout, and includes a plurality of second active areas corresponding to the desired three-dimensional active areas, adjacent second active areas being spaced apart by an isolation region, a cumulative total of widths of the second active areas and widths of one or more of the isolation regions being substantially equivalent to the first width, the isolation region between adjacent second active areas having a second length, wherein each of the second active areas has the first length and each isolation area has the second length extending across the entire length of the first active area such that the second length is substantially equivalent to the first length.

7. The method of claim 6, wherein the first gate has a width less than about 65 nm.

8. The method of claim 6, wherein a width of each of the second active areas is less than the first length.

9. The method of claim 6, wherein the first layout further comprises a second gate extending over the first active area, the first active area having an L shape such that the first active area has a first region having the first width and a second region having a second width, the plurality of second active areas in the second layout including a first number of second active areas having one length corresponding to the first width and a second number of second active areas having another length corresponding to the second width, the second layout having a greater number of second active areas in the first region than the second region.

10. The method of claim 6, wherein a width of the isolation region is greater than a width of one of the second active areas.

11. The method of claim 6, wherein the first width is greater than the first length.

12. The method of claim 6, wherein the second length is equivalent to the first length.

13. A computer program product for generating a layout of a semiconductor device having a finFET device, the computer program product having a non-transitory computer-readable medium with a computer program embodied thereon, the computer program product comprising:

computer program code for determining a number of three-dimensional structures defining desired three-dimensional active areas;

computer program code for creating an equivalent planar device design based upon the number of three-dimensional structures defining the desired three-dimensional active areas, wherein the equivalent planar device design has an active area size substantially equivalent to a size of the three-dimensional active areas plus any intermediate isolation areas; and computer program code for converting the equivalent planar device design to a three-dimensional design, wherein the computer program code for converting the equivalent planar device design to a three-dimensional design includes:

computer program code for receiving a first layout, the first layout having a plurality of active areas in a first region, the plurality of active areas being sized and placed based upon a desired layout of the finFET device, computer program code for determining for each of the plurality of active areas a number of active regions; and computer program code for determining a width for each active area of the plurality of active areas, wherein the width of each active area is based upon the number of active regions defining at least one of the desired three-dimensional active areas plus any intermediate isolation areas, wherein determining the width of each active area is based on a model equation expressed as:

$$y=(A \times B)+((A-1) \times C)$$

wherein y denotes the width, A denotes the number of active regions, B denotes a width of each of the active regions, and C denotes a width of each of the intermediate isolation areas;

computer program code for directly generating a second layout based upon the first layout, the second layout replacing each of the plurality of active areas with the active regions and isolation regions located between adjacent active regions in a plan view, a total area of each of the plurality of active areas being substantially equal to a total area of the respective active regions including isolation regions separating adjacent active regions, wherein each of the active regions within each respective active area has a length extending across an entire length of the respective active area and each of the isolation regions within each respective active area has a length extending across the entire length of the respective active area such that the respective lengths of the active regions and the isolation regions within each respective active area are substantially equal.

14. The computer program product of claim 13, wherein the first layout includes one or more planar FETs having a gate length less than about 65 nm.

15. The computer program product of claim 13, wherein a width of each active regions is less than a gate length of a gate overlying at least one of the plurality of active areas.

16. The computer program product of claim 13, wherein a width of each active regions is equal to about two-thirds of a gate length overlying at least one of the plurality of active areas.

17. The computer program product of claim 13, wherein the first layout further comprises an L-shaped active area and a first gate and a second gate overlying the L-shaped active area, the L-shaped active area having a first width and a second width, the first gate overlying the first width and the second gate overlying the second width, wherein the computer program code for directly generating includes computer program code for defining a plurality of second active areas in the second layout including a first number of second active areas having one length corresponding to the first width and a second number of second active areas having another length corresponding to the second width.

18. The computer program product of claim 17, wherein a width of isolation regions between adjacent second active areas is greater than a width of one of the second active areas.

19. The computer program product of claim 13, wherein the first layout further includes a second region, and wherein the computer program code for directly generating includes computer program code to include planar active areas located in the second region as planar active areas in the second layout.

20. The computer program product of claim 19, wherein the first region is a core region and the second region is a peripheral region.

* * * * *